(12) United States Patent
Nian et al.

(10) Patent No.: US 12,362,273 B2
(45) Date of Patent: Jul. 15, 2025

(54) CONDUCTIVE STRUCTURES AND METHODS OF FABRICATION THEREOF

(71) Applicant: TAIWAN SEMICONDUCTOR MANUFACTURING COMPANY, LTD., Hsinchu (TW)

(72) Inventors: Jun-Nan Nian, Tainan (TW); Yao-Hsiang Liang, Hsinchu (TW); Jian-Shin Tsai, Tainan (TW); Ming-Ching Chung, Tainan (TW); Chun-I Liao, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 494 days.

(21) Appl. No.: 17/745,890

(22) Filed: May 17, 2022

(65) Prior Publication Data

US 2023/0215802 A1  Jul. 6, 2023

Related U.S. Application Data

(60) Provisional application No. 63/295,469, filed on Dec. 30, 2021.

(51) Int. Cl.
*H01L 21/00* (2006.01)
*H01L 21/768* (2006.01)
*H01L 23/522* (2006.01)
*H01L 23/532* (2006.01)

(52) U.S. Cl.
CPC .... *H01L 23/5226* (2013.01); *H01L 21/76831* (2013.01); *H01L 21/76846* (2013.01); *H01L 21/76885* (2013.01); *H01L 23/53238* (2013.01); *H01L 23/53266* (2013.01)

(58) Field of Classification Search
CPC ......... H01L 21/76831; H01L 21/76832; H01L 21/76846; H01L 23/5226; H01L 23/53233; H01L 23/53238; H01L 23/53266
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |

(Continued)

FOREIGN PATENT DOCUMENTS

| | | |
|---|---|---|
| TW | 201602424 A | 1/2016 |
| TW | 201827636 A | 8/2018 |

(Continued)

*Primary Examiner* — Reema Patel
(74) *Attorney, Agent, or Firm* — NZ Carr Law Office

(57) ABSTRACT

Embodiments of the present disclosure relate to methods of fabricating conductive features to prevent metal extrusion. Particularly, the conductive feature includes a control layer to reduce grain size of a metal containing layer, thus obtaining a robust structure to decrease extrusion defects. In some embodiments, the control layer is formed between a barrier layer and the conductive feature. In some embodiments, the control layer is formed by adding a control element, such as oxygen, to an upper portion of the barrier layer.

20 Claims, 18 Drawing Sheets

(56) References Cited

U.S. PATENT DOCUMENTS

| | | | |
|---|---|---|---|
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2016/0155686 | A1* | 6/2016 | Lee .................... H01L 23/5226 257/737 |
| 2019/0304939 | A1 | 10/2019 | Bih et al. |
| 2020/0044049 | A1 | 2/2020 | Yeoh et al. |
| 2020/0203352 | A1 | 6/2020 | Im et al. |
| 2021/0098534 | A1 | 4/2021 | Wu et al. |

FOREIGN PATENT DOCUMENTS

| | | |
|---|---|---|
| TW | 201916125 A | 4/2019 |
| TW | 202025250 A | 7/2020 |
| TW | 202025284 A | 7/2020 |
| TW | 202141588 A | 11/2021 |

\* cited by examiner

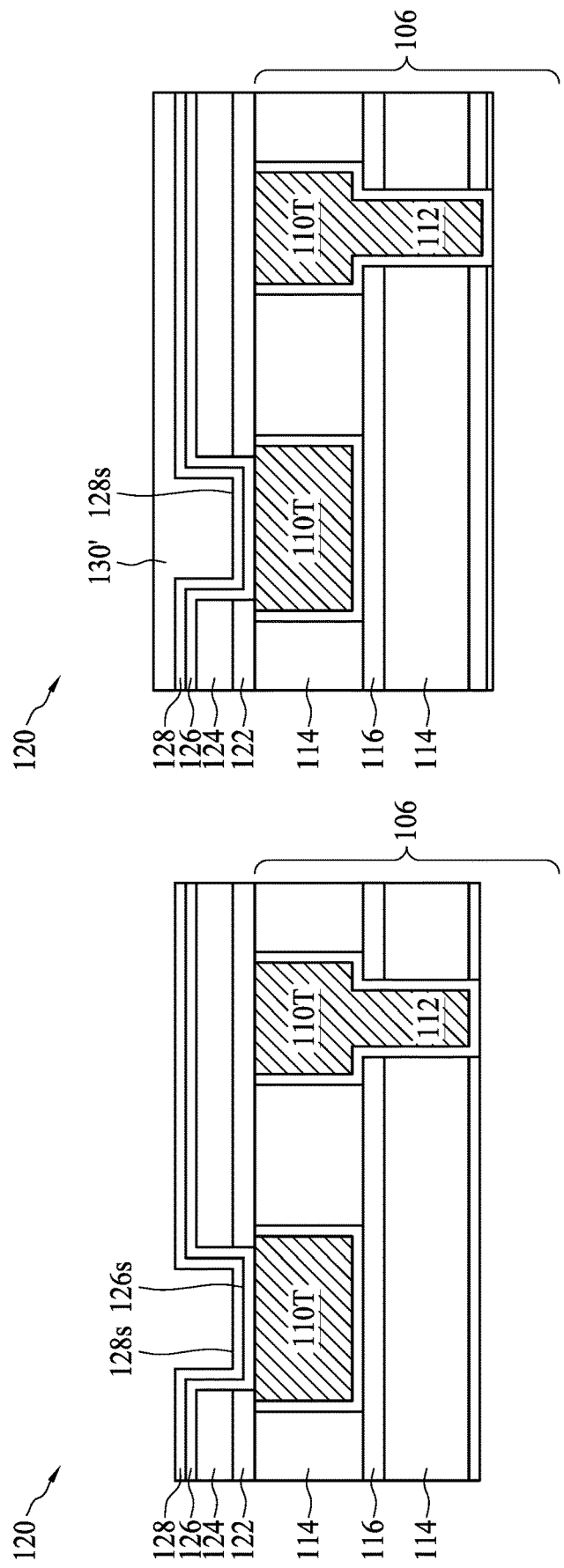

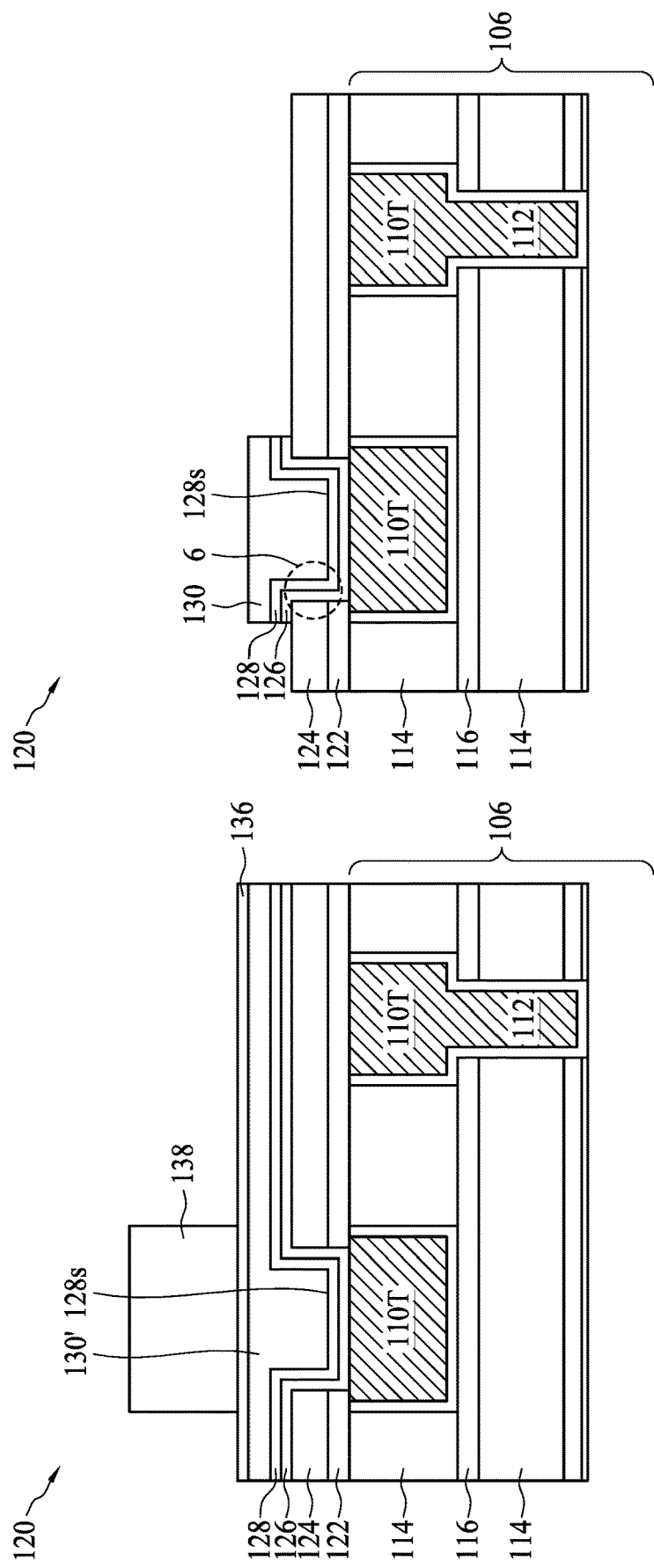

CONDUCTIVE STRUCTURES AND METHODS OF FABRICATION THEREOF

BACKGROUND

Semiconductor devices are used in a variety of electronic applications, such as personal computers, cell phones, digital cameras, and other electronic equipment. Semiconductor devices are typically fabricated by sequentially forming insulating or dielectric layers, conductive layers, and semiconductor layers of material over a semiconductor substrate to form circuit components and elements on the semiconductor substrate.

Conductive features, such as conductive lines and vias in an interconnect structure, and conductive pad structures on an interconnect structure, such as bond pads, are formed over a semiconductor substrate to connect the semiconductor devices with external electronic elements. Because the bond pads, the conductive features connected to the bond pads, and dielectric material surrounding the bond pads and the conductive features may be formed from different materials may expand at different rate during subsequent thermal processing, conductive materials may extrude to surrounding areas causing extrusion defects. Therefore, there is a need improved conductive features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4K schematically illustrate various stages of manufacturing a conductive pad structure according to embodiments of the present disclosure.

DETAILED DESCRIPTION

Figure 1:
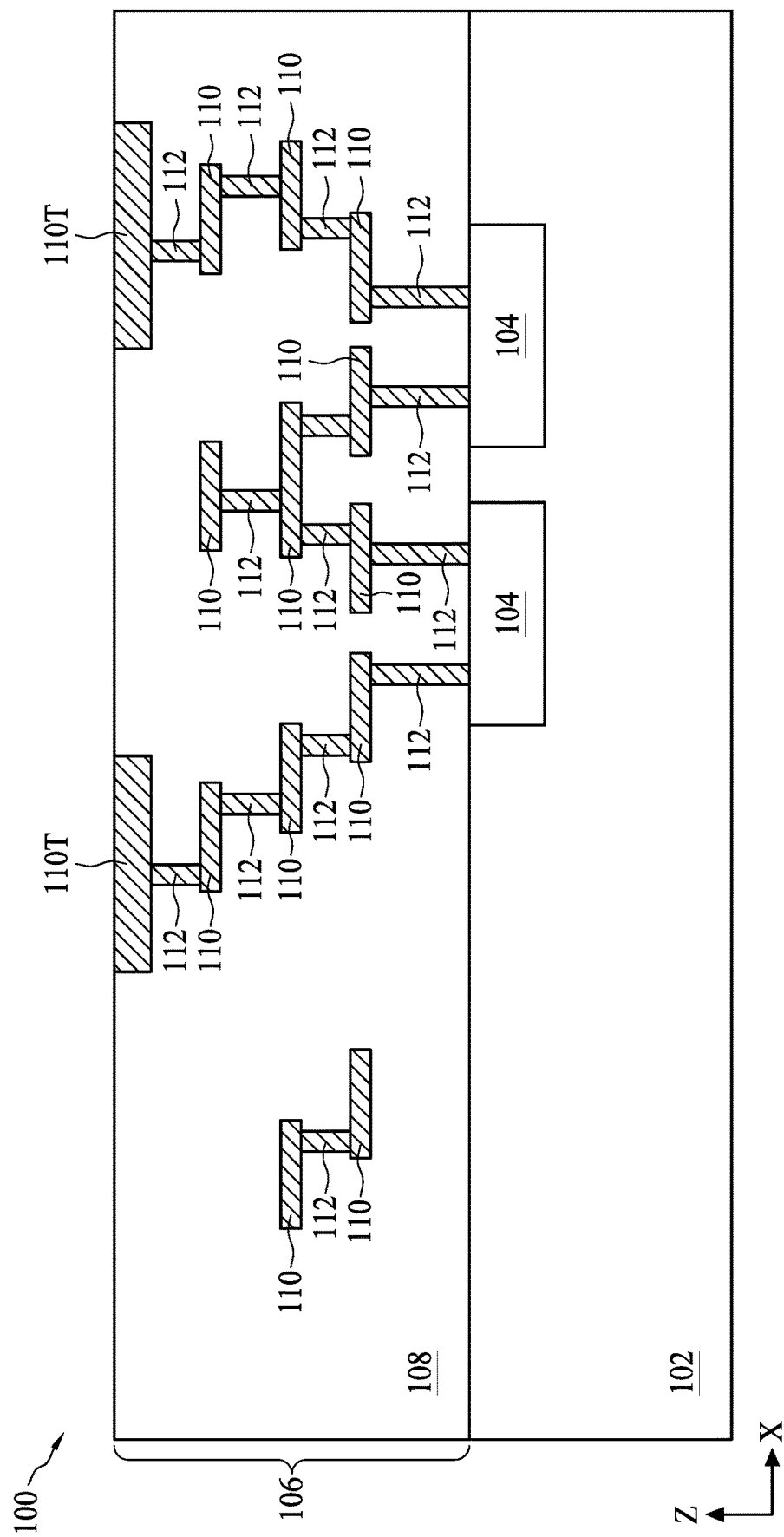
FIG. 1 is a schematic cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments. Some embodiments described herein are described in the context of a conductive pad structure of semiconductor devices and methods for forming the conductive pad structure. The semiconductor devices may be any type semiconductor devices having contact pads and/or bond pads for electrical connection. The semiconductor devices are for example, Fin Field Effect Transistor (FinFET) devices, semiconductor image sensor devices, or other semiconductor devices. In addition, the conductive pad structures of the embodiments of the disclosure may be applied to three-dimensional (3D) packages for bonding stacked dies, chips, fabricated wafers, or interposer substrates. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more operations than what is described herein.

Embodiments of the present disclosure relates to methods for forming a back end of line structure on semiconductor devices, such as an interconnect structures, contact pads, and the semiconductor devices formed there from. Embodiments disclosed herein relate generally to fabricating conductive features with a control layer to prevent extrusion defects in a semiconductor device. For example, the extrusion from thermal expansion of a conductive layer under the conductive pad structure and/or from an aluminum-containing layer of the conductive pad structure. Particularly, embodiments of the present disclosure relate to using a control layer to reduce grain size of conductive features, thus obtaining a robust structure to decrease extrusion defect. In some embodiments, the control layer is formed between a top conductive layer in an interconnection structure and a conductive pad formed on the top conductive layer. In other embodiments, the control layer is formed between an upper level conductive feature and a lower metal layer within an interconnection structure.

The control layer may achieve gradual increase of grain size in the conductive feature formed therefrom, thus, reducing defects from extrusion. In some embodiments, the control layer may be formed by controlling concentration of elements to reduce grain size by crystalline mismatch. In some embodiments, the control layer comprises a metal element, such as tantalum, titanium, and tungsten, oxygen, and nitrogen (MxNyOz, where M denotes a metal element, x, y, and z are numerals). In some embodiments, concentrations of M/Oxygen/Nitrogen may be managed to reduce grain size at an interface layer of the conductive feature formed on the control layer.

FIG. 1 is a schematic cross-sectional view of a semiconductor device 100 in accordance with some embodiments of the present disclosure. The semiconductor device 100 may be formed in and/or on a substrate 102. The substrate 102 may be a bulk semiconductor substrate, a semiconductor-on-insulator (SOI) substrate, or other semiconductor substrate, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or other insulating material. The insulator layer is provided on a silicon or glass substrate. The substrate 102 may be made of silicon or other semiconductor material. For example, the substrate 102 is a silicon wafer. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

One or more electronic components 104 are formed in and/or on the substrate 102. The electronic components 104 may include active electronic components, such as field-effect transistors (FETs), metal-oxide-semiconductor field-effect transistors (MOSFETs), complementary metal-oxide-semiconductor (CMOS) transistors, bipolar transistors, high voltage transistors, high frequency transistors, memory cells, and/or a combination thereof. The electronic components 104 may include passive electronic components, such as resistors, capacitors, and inductors. The electronic components 104 may form various functional circuits, such as memory cells and logic circuits, on the substrate 102.

An interconnect structure 106 is formed over the substrate 102 with electrically connections to various electronic components 104. The interconnect structure 106 typically includes various conductive features, such as a first plurality of conductive features 110 and second plurality of conductive features 112, and intermetal dielectric (IMD) layers 108 to separate and isolate various conductive features 110, 112. In some embodiments, the first plurality of conductive features 110 are conductive lines and the second plurality of conductive features 112 are conductive vias. The interconnect structure 106 includes multiple levels IMD layers 108 with the conductive features 110, and the conductive features 110 arranged in each level to provide electrical paths to various electronic components 104 disposed below. The conductive features 112 provide vertical electrical routing from the electronic components 104 to the conductive features 110 and between conductive features 110 in different levels. For example, the bottom-most conductive features 112 of the interconnect structure 106 may be electrically connected to the conductive contacts disposed over source/drain regions and gate electrode layers in transistors in the electronic components 104. The interconnect structure 106 may include a plurality of levels, such as five to ten levels, of the conductive features 110 vertically connected by the conductive features 112. Dimensions of the conductive features 110, 112 gradually increase from lower levels, which are closer to the electronic components 104, to upper levels. The top most level of the conductive features 110 are commonly referred to as top metal layer or top conductive features, marked as 110T in the figures.

The conductive features 110, 112 may be made from one or more electrically conductive materials, such as metal, metal alloy, metal nitride, or silicide. For example, the conductive features 110, 112 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof. In some embodiments, the conductive features 110, 112 at different levels are made of the same material, such as selected from a group consisting of aluminum, aluminum silicon, copper, tungsten other metals and various alloys. In one embodiment, the conductive features 110, 112 are all made of copper. In other embodiments, the conductive features 110, 112 are different levels are made of different materials. For example, the conductive features 110, 112 at lower levels may be formed from copper or tungsten, and the conductive features 110 at upper levels may be formed from aluminum or aluminum alloy. In some embodiments, the conductive features 110 and conductive features 112 may include barrier type material as a liner at interfaces with the IMD layers 108 and/or with each other.

In some embodiments, the IMD layers 108 may include multiple layers of dielectric materials, such as alternatively arranged interlayer dielectric layer (ILD) and etch stop layer (ESL). The ILD layers may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide). The ESL layer may SiNx, SiCxNy, AlNx, AlOx, AOxNy, SiOx, SiCx, SiOxCy, or other suitable materials.

In some embodiments, the conductive features 110 and conductive features 112 are formed level by level using a damascene process, such as a dual damascene process. In the dual damascene process, a via opening and a trench opening are formed in the IMD layers 108 using two etching processes, in which the trench opening is above the via opening. The via opening and the trench opening are filled with a conductive material. Then, the conductive material outside of the trench opening is removed by a planarization process such as a chemical mechanical polishing (CMP) process to form the conductive features 110 in the trench openings and the conductive features 112 in the via openings in the IMD layer 108.

Figure 2B:
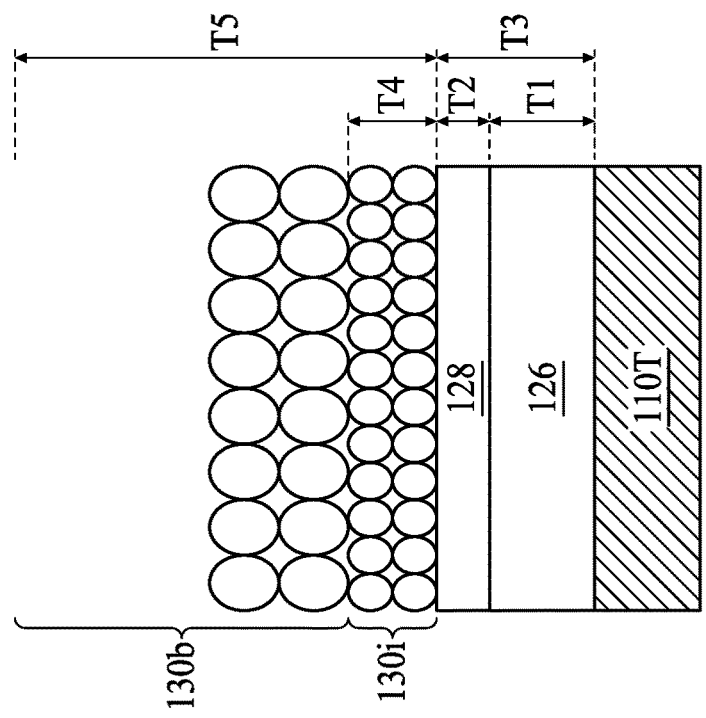
FIGS. 2A-2B schematically illustrate a conductive pad structure according to some embodiments of the present disclosure.
Figure 2A:
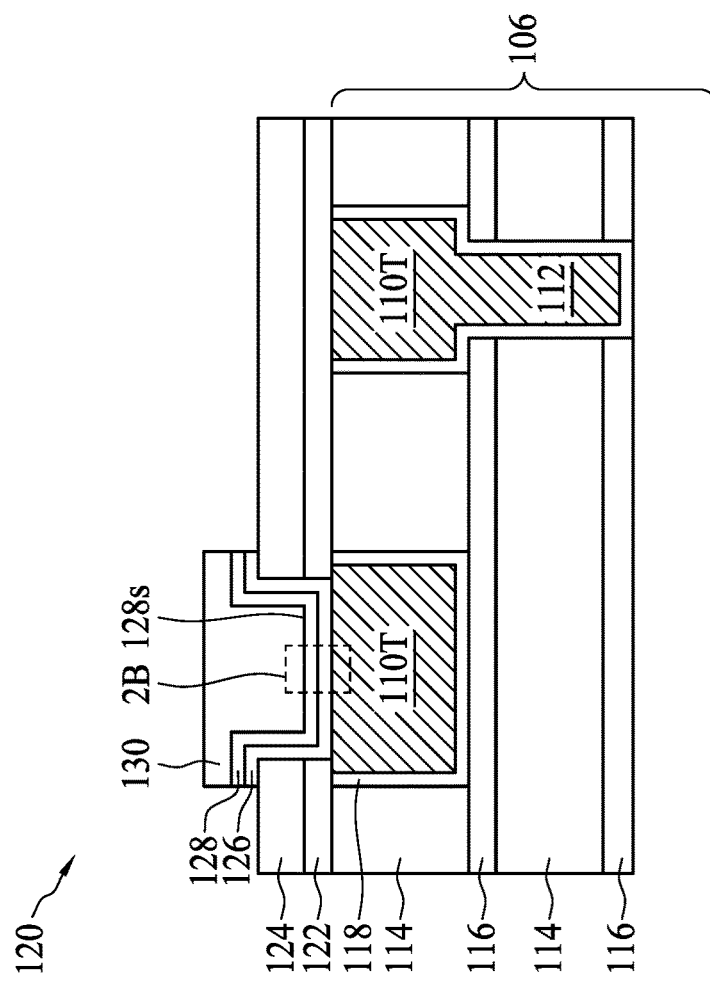

In some embodiments, a control layer according to embodiments of present disclosure is formed in conductive pad structures, which are formed on a top conductive layer of an interconnect structure, such as on the top conductive features 110T of the interconnect structure 106. FIGS. 2A-2B schematically illustrate a cross-sectional view of a conductive pad structure 120 according to some embodiments of the present disclosure.

In FIG. 2A, the conductive pad structure 120 is formed on one of the top conductive features 110T of the interconnect structure 106. Multiple conductive pad structures 120 may be formed over the top conductive features 110Ts for providing electrical connections for external components, such as bonding wires and solder balls (not shown) to be bond with the conductive pad structure 120. As shown in FIG. 2A, the interconnect structure 106 includes multiple low-k dielectric layers 114 alternatively stacked with etch stop layers 116. The top conductive features 110T are embedded in the top-most low-k dielectric layer 114 in the interconnect structure 106. The top conductive features 110T are connected to lower level conductive features 110 through conductive features 112. In some embodiments, a barrier layer 118 may be formed between the conductive features 110, 110T, 112 and the lower-k dielectric layers 114 and the etch stop layers 116. The barrier layer 118 functions to prevent diffusion of metal elements, such as copper or aluminum in the conductive features 110, 100T, 112 into the surrounding dielectric materials. The conductive pad structure 120 is formed over the top conductive feature 110T via an opening in a passivation layer 124 deposited on the interconnect structure 106. In some embodiments, an etch stop layer 122 may be formed between the passivation layer 124 and the interconnect structure 106.

The conductive pad structure 120 includes a barrier layer 126 on the top conductive feature 110T, a control layer 128 on the barrier layer 126, and a conductive pad 130 on the control layer 128. In some embodiments, the composition of the control layer 128 is selected to have a crystalline mismatch with the composition in the conductive pad 130 to reduce grain size in the conductive pad 130. The reduced grain size in the conductive pad 130 results in reduced thermal coefficient in the conductive pad 130 because smaller grain size expands less in response to temperature increase. The conductive pad 130 includes one or more metallic elements, such as aluminum, copper, and tantalum, silicon, or an alloy thereof. In some embodiments, the conductive pad 130 may be aluminum copper alloy. Material of the conductive pad 130 has higher thermal expansion coefficients than dielectric materials surrounding the conductive pad structure 120.

It has been observed that the higher thermal expansion coefficient in conductive pads may lead to the conductive pad to extrude into surrounding dielectric materials, resulting extrusion defects during subsequent thermal processing. The conductive pad may expand more than the surrounding dielectric material and extrude into the dielectric material, leading to failures such as short circuits. For example, if the conductive pad 130 is extruded into the space between adjacent conductive pad structures 120 after the semiconductor device 100 is subjected to a thermal process, there will be a short circuit between the adjacent conductive pad structures 120. The reduced grain size in the conductive pad 130 according to the present disclosure reduces thermal expansion of the conductive pad 130, therefore, avoiding extrusion induced failures. Additionally, as a result of the control layer 128, the conductive pad 130 also has gradually increased grain size. The gradually increased grain size in the conductive pad 130 also reduces stress within the conductive pad 130 thus reducing defects caused by compressive stress in the conductive pad 130.

The barrier layer 126 may include a metal nitride film, such as tantalum nitride (TaN), titanium nitride (TiN), tungsten nitride (WN), or other suitable metal nitride film suitable for metal barrier. In some embodiments, the metal element in the barrier layer 126 has a higher concentration in atomic ratio than nitrogen.

In some embodiments, the control layer 128 may include elements in the barrier layer 126 and one control element. In some embodiments, the control element may be oxygen. For example, the control layer 128 may include a compound in the form of $M_xN_yA_z$, where M represents a metal element, and A represents an added control element. In some embodiments, the control layer 128 may include a compound in the form of $Ta_xN_yO_z$. In some embodiments, nitrogen and/or the added element A has a higher concentration in atomic ratio than the metal element M within the control layer 128. In some embodiments, the control layer 128 further includes elements included in the conductive pad 130. For example, the control layer 128 may include aluminum, copper, tantalum, silicon.

According to some embodiments, the conductive pad 130 may include an interface layer 130$i$ and a bulk layer 130$b$. The interface layer 130$i$ is formed on the control layer 128 with smaller grain size and the bulk layer 130$b$ is formed on the interface layer 130$i$ with larger grain size. The grain size of the conductive pad 130 gradually increases from the interface layer 130$i$ to the bulk layer 130$b$.

FIG. 2B is a schematic enlarged view of an interface area marked 2B in FIG. 2A. As marked in FIG. 2B, the barrier layer 126 has a thickness T1 formed on the top conductive feature 110T. The control layer 128 has a thickness T2. The barrier layer 126 and the control layer 128 have a combined thickness T3. In some embodiments, the thickness T3 may be in a range between 10 nm and 200 nm.

In some embodiments, the thickness T2 is in a range between about 2 angstrom and 5 nm. If thinner than 2 angstrom, the control layer 128 may not be sufficient to alter grain size in the conductive pad 130. If thicker than 5 nm, the control layer 128 may increase electrical resistance of the conductive pad structure 120 without additional benefit of reduced grain size in the conductive pad 130.

In some embodiments, a ratio of the thickness T2 of the control layer over the combined thickness T3 of the barrier layer 126 and control layer 128 is in a range between about 0.01 and about 0.5. A ratio lower than 0.01 may not be sufficient to alter grain size in the conductive pad 130. A ratio higher than 0.5 may increase electrical resistance of the conductive pad structure 120 without additional benefit of reduced grain size in the conductive pad 130.

The conductive pad 130 is formed on the control layer 128. The conductive pad 130 includes a major conductive material, such as aluminum, copper, tantalum, silicon, a combination, or any suitable conductive material. In some embodiments, the conductive pad 130 may be a metal compound, for example a metal compound comprising aluminum. The interface layer 130$i$ of the conductive pad 130 has a thickness T4. In some embodiments, the conductive pad 130 includes an aluminum copper alloy (AlCu). The bulk layer 130$b$ of the conductive pad 130 has a thickness T5. The interface layer 130$i$ and the bulk layer 130$b$ has a combined thickness T6. The bulk layer 130$b$ may have a grain size in a range between 300 nm and 1200 nm to achieve desired functions. In some embodiments, the interface layer 130$i$ has a grain size in a range between 10 nm and about 400 nm. An interface layer 130$i$ with grain size greater than 400 nm is unlikely to reduce thermal expansion to prevent extrusion defects. An interface layer 130$i$ with grain size smaller than 10 nm may affect properties of the conductive pad 130, such as reducing thermal conductivity, without additional benefit of reduced extrusion defects.

In some embodiments, the thickness T4 of the interface layer 130$i$ is in a range between about 5 nm and about 100 nm according to circuit design. An interface layer thinner than 5 nm may not be sufficient to reduce thermal expansion to prevent extrusion defects. An interface layer thicker than 100 nm may affect properties of the conductive pad 130, such as reducing thermal conductivity, without additional benefit of reduced extrusion defects.

In some embodiments, the combined thickness T6 is in a range between about 100 nm and about 5000 nm according to circuit design. In some embodiments, a ratio of the thickness T4 over the combined thickness T6 is in a range between about 0.01 and about 0.1. A ratio lower than 0.01 may not be sufficient to reduce thermal expansion to prevent extrusion defects. A ratio higher than 0.1 may affect properties of the conductive pad 130, such as reducing thermal conductivity, without additional benefit of reduced extrusion defects.

Figure 3:
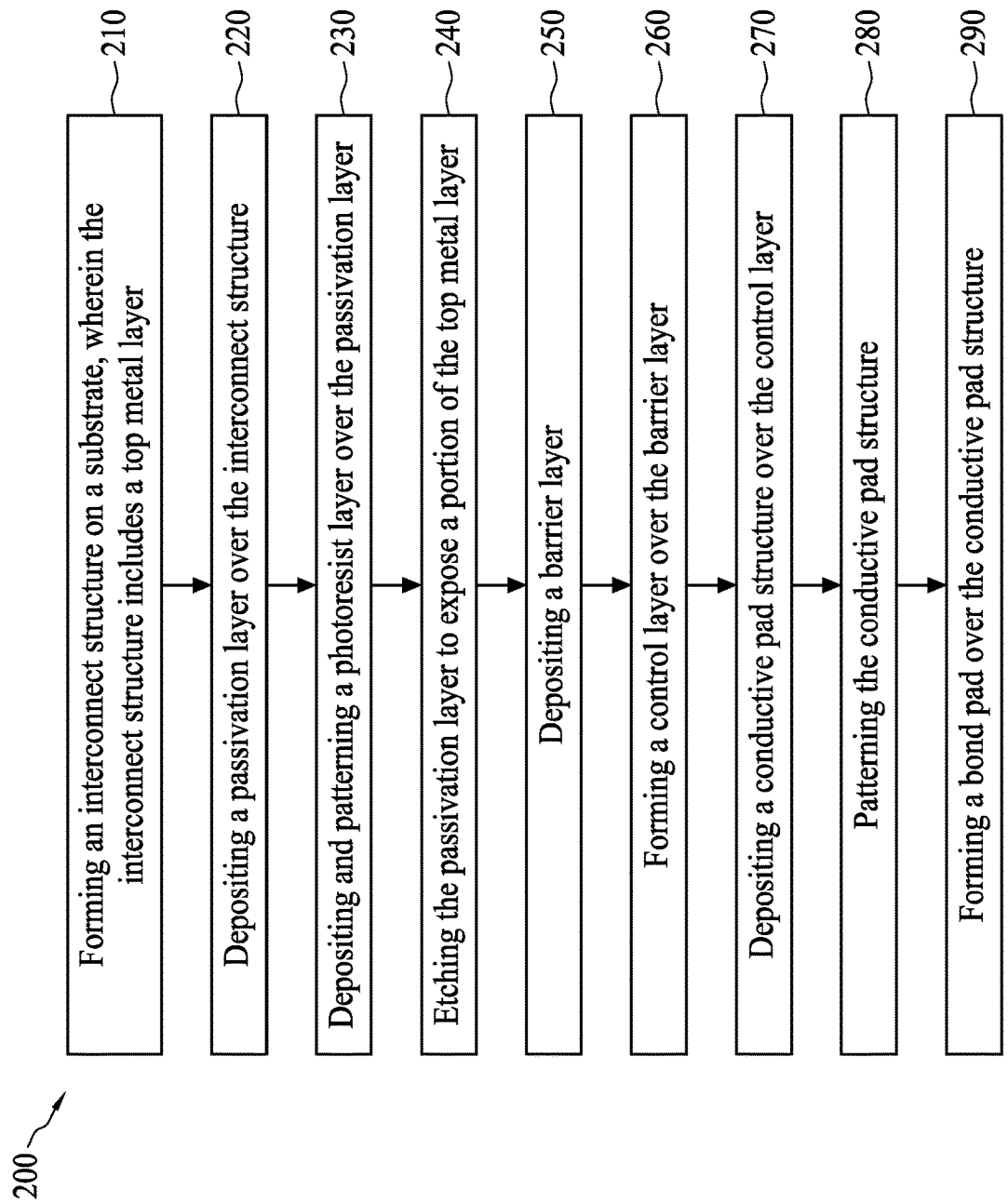
FIG. 3 is a flow chart of a method for manufacturing of a conductive pad structure according to embodiments of the present disclosure.

FIG. 3 is a flow chart of a method 200 for manufacturing of a semiconductor device, such as the semiconductor device 100, according to embodiments of the present disclosure. The semiconductor device 100 may be formed using the method 200. FIGS. 4A-4K schematically illustrate various stages of manufacturing the semiconductor device 100 according to embodiments of the present disclosure. FIGS. 4A-4K are schematic partial sectional views of the semiconductor device 100.

Figures 4A, 4B:
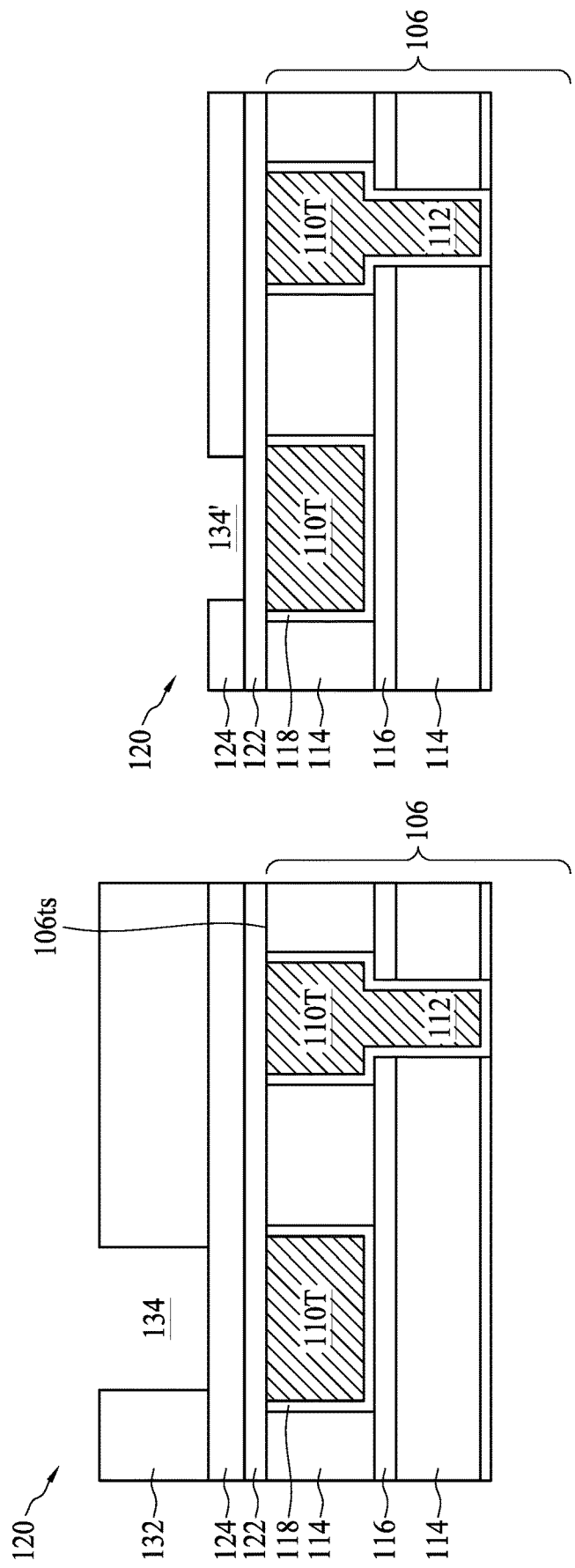

In operation 210, an interconnect structure is formed over a substrate having a plurality of electronic components, such as the interconnect structure 106 formed over the substrate 102 with a plurality of electronic components 104 as described in FIGS. 1 and 2A. FIG. 4A is a schematic partial sectional view of the semiconductor device 100 showing the top conductive features 110T of the interconnect structure 106. The multiple levels of conductive features 110 and 112 may be formed level by level using suitable metallization processes, such as damascene process. The interconnect structure 106 has a top surface 106ts resulting from a planarization process. The top surface 106ts may include areas of the top conductive features 110T, the low-k dielectric layer 114, and the barrier layer 118 formed between the top conductive features 110T and the low-k dielectric layer 114.

In operation 220, a passivation layer is deposited over the interconnect structure. As shown in FIG. 4A, the passivation layer 124 is deposited over the top surface 106ts of the interconnect structure 106. In some embodiments, an etch stop layer, such as the etch stop layer 122 is first deposited on the top surface 106ts. The passivation layer 124 is deposited on the etch stop layer 122. In some embodiments, the passivation layer 124 may include of an organic insulating material such as polyimide, epoxy resin or another suitable insulating material. In other embodiments, the passivation layer 124 may include an inorganic insulating material such as silicon oxide, silicon nitride, silicon oxynitride or suitable low-k dielectric material. The etch stop layer 122 may include a dielectric material having an etch selectivity over the passivation layer 124 and the conductive features 110. In some embodiments, the etch stop layer 122 may include SiNx, SiCxNy, AlNx, AlOx, AOxNy, SiOx, SiCx, SiOxCy, or other suitable materials.

In operation 230, a photoresist layer 132 is deposited over the passivation layer 124 and subsequently patterned to form an opening 134, as shown in FIG. 4A. Operation 230 may be performed by any suitable photolithography. The opening 134 is aligned with one of the top conductive features 110T so that the subsequently formed conductive pad structure is formed on the top conductive feature 110T.

Figure 4D:
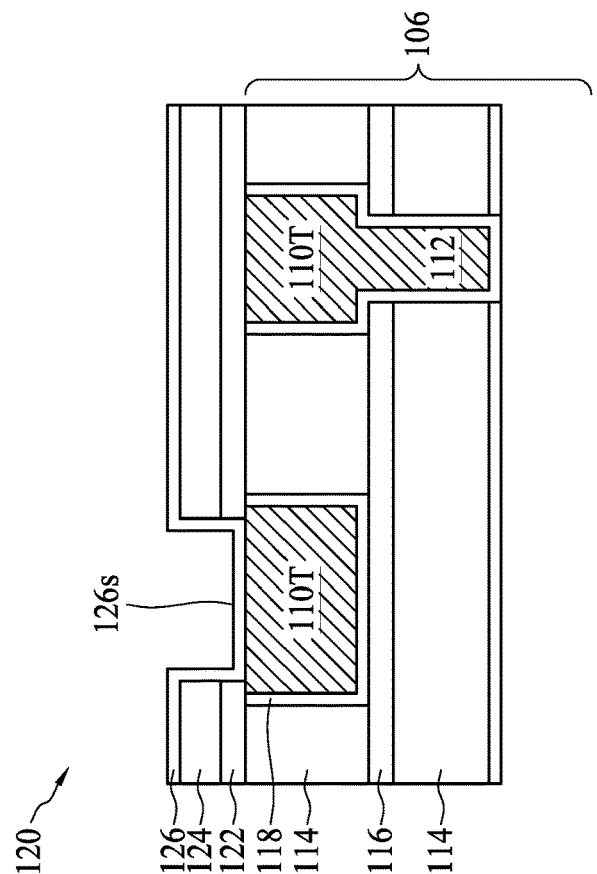
Figure 4C:
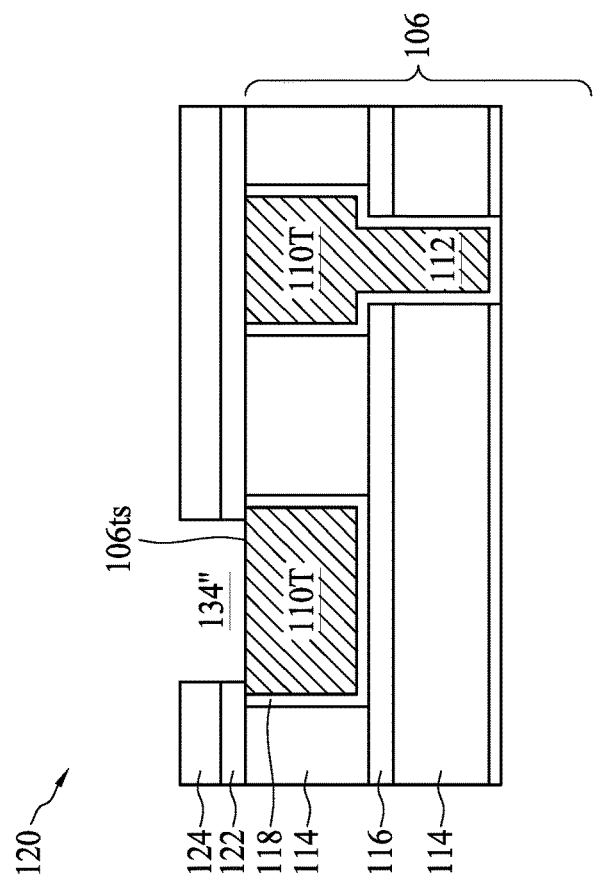

In operation 240, the passivation layer 124 and the etch stop layer 122 are etched using the patterned photoresist layer 132 to expose the top conductive feature 110T, as shown in FIGS. 4B-4C. As show in FIG. 4B, a suitable etch method may be used to transfer the opening 134 in the photoresist layer 132 to the passivation layer 124. An opening 134' is formed in the passivation layer 124. The etch stop layer 122 protects the top conductive feature 110T underneath. The etch stop layer 122 is then removed using a suitable etch method to expose a top surface 110ts of the top conductive feature 110T, as shown in FIG. 4C. As shown in FIG. 4C, an opening 134" is formed over the conductive feature 110T. The opening 134" has a bottom defined by the top surface 110ts of the top conductive feature 110T, and sidewalls of the passivation layer 124 and the etch stop layer 122.

In operation 250, the barrier layer 126 is deposited over exposed surfaces of the substrate 102, as shown in FIG. 4D. The barrier layer 126 may be deposited conformally on the exposed top surface 110ts of the top conductive features 110T, exposed surfaces of the passivation layer 124, and exposed surfaces of the etch stop layer 122. In some embodiments, the barrier layer 126 includes one or more barrier materials, such as Ta, TaN, Ti, TiN, WN, or the like. In some embodiments, the barrier layer 126 includes a nitride of a first metal element. The first metal element may be tantalum, titanium, tungsten, or other suitable element. The barrier layer 126 may be deposited by any suitable process, such as a physical vapor deposition (PVD) process, sputtering, evaporation, atomic layer deposition (ALD) process or another suitable deposition process. The barrier layer 126 may have a thickness in a range between about 10 nm and about 200 nm.

In some embodiments, the barrier layer 126 may have substantially consistent composition through its thickness, i.e. atomic concentrations of the metal element and the nitrogen in the barrier layer 126 are substantially consistent across the thickness of the barrier layer 126. For example, atomic concentrations of the metal element and the nitrogen in the barrier layer 126 are substantially consistent across the thickness of the barrier layer 126. In other embodiments, the barrier layer 126 may include two or more sublayers of different compositions. For example, the barrier layer 126 may have a first sublayer barrier disposed on the top conductive features 110T and a second sublayer barrier disposed on the first sublayer barrier. The first metal element may have different atomic concentration in the first and second sublayers. For example, the atomic concentration of the first metal element in the first sublayer barrier is higher than the atomic concentration of the first metal element in the second sublayer barrier. In other embodiments, the barrier layer 126 may have gradually varied composition across the thickness. For example, the atomic concentration of nitrogen in the barrier layer 126 gradually increases from the top surface 110ts along the thickness.

In operation 260, the control layer 128 is formed on the barrier layer 126, as shown in FIG. 4E. The control layer 128 may be conformally formed on the barrier layer 126. The control layer 128 includes a composition having a crystalline structure that is mismatch with the crystalline structure of the subsequently formed conductive pad 130. In some embodiments, properties of the control layer 128, such as the composition, the thickness, may be selected according to the composition of the conductive pad 130 to reduce grain size in the conductive pad 130. The control layer 128 may have a thickness in a range between about 2 angstrom and 5 nm.

In some embodiments, the control layer 128 comprises a control element, and elements in the barrier layer 126. For example, when the barrier layer 126 includes a first metal element and nitrogen, the control layer 128 may include nitrogen, the first metal element, and oxygen as the control element. In some embodiments, the first metal element may have different concentration in the barrier layer 126 and in the control layer 128.

Figure 5A:
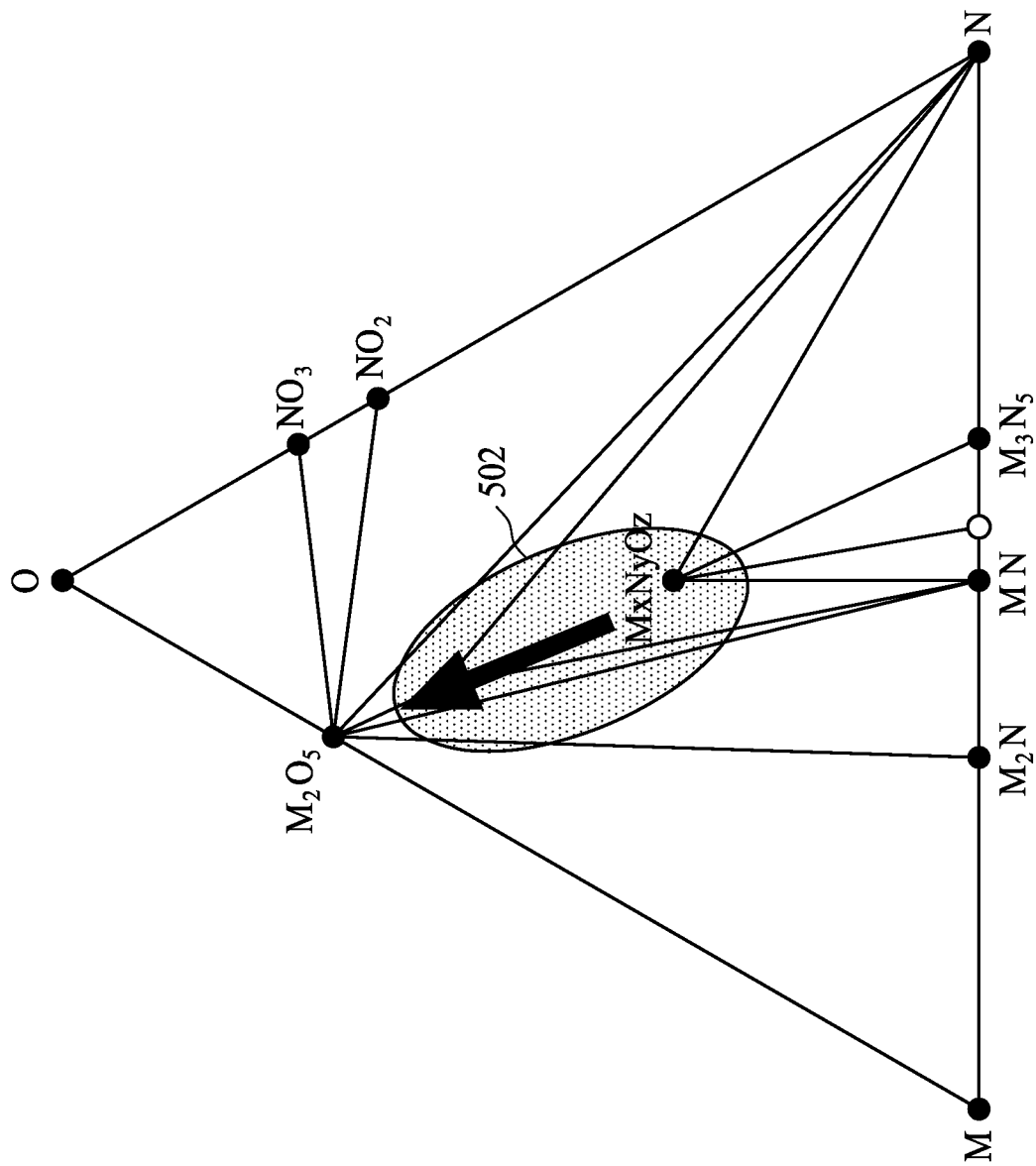
FIG. 5A is a schematic chart showing composition selection of a control layer according to the present disclosure.

FIG. 5A is a schematic chart showing selection of the composition of the control layer 128 according to embodiments of the present disclosure. In FIG. 5A, the area in a triangle represent compositions of different compounds MxNyOz including element M, N, and O. Each vertex M, N, and O of the triangle represents a composition of 100% element M, a composition of 100% element N, and a composition of 100% element O respectively. The element M may be a metal element, such as Ta, Ti, W, or other suitable elements. N represents nitrogen. O represents oxygen. In some embodiments, the control layer 128 has a composition MxNyOz with x, y, z selected in a shade region 502. In some embodiments, the control layer 128 includes a composition MxNyOz, with y>x or z>x, which means that the atomic ratio of the control element, such as oxygen, is higher than both the atomic concentrations of M element, and the atomic concentration of nitrogen. In some embodiment, the control layer 128 includes a composition MxNyOz with z>x, that the atomic ratio of the control element, such as oxygen, is higher than the atomic concentration of M element.

In some embodiments, the control layer 128 is formed by depositing a new film on a top surface 126s of the barrier layer 126. In some embodiments, the barrier layer 126 and the control layer 128 may be deposited using two different processing chambers. In some embodiments, the barrier layer 126 and the control layer 128 may be formed in the same chamber consecutively or in separate sessions. For example, the barrier layer 126 may be first deposited to a desired thickness in a process chamber, such as a PVD chamber. The control layer 128 deposited in the same process chamber by adding and changing processing gases and/or conditions. For example, the control layer 128 may be formed in the same PVD chamber by adding a gas source for the control element and reducing the gas sources used for depositing the barrier layer 126.

In some embodiments, the control layer 128 may be formed by adding the control element to an upper portion of the barrier layer 126. For example, the control layer 128 is formed by oxidizing the upper portion of the barrier layer 126 using a suitable oxidazing agent, such as ozone.

Figure 5B:
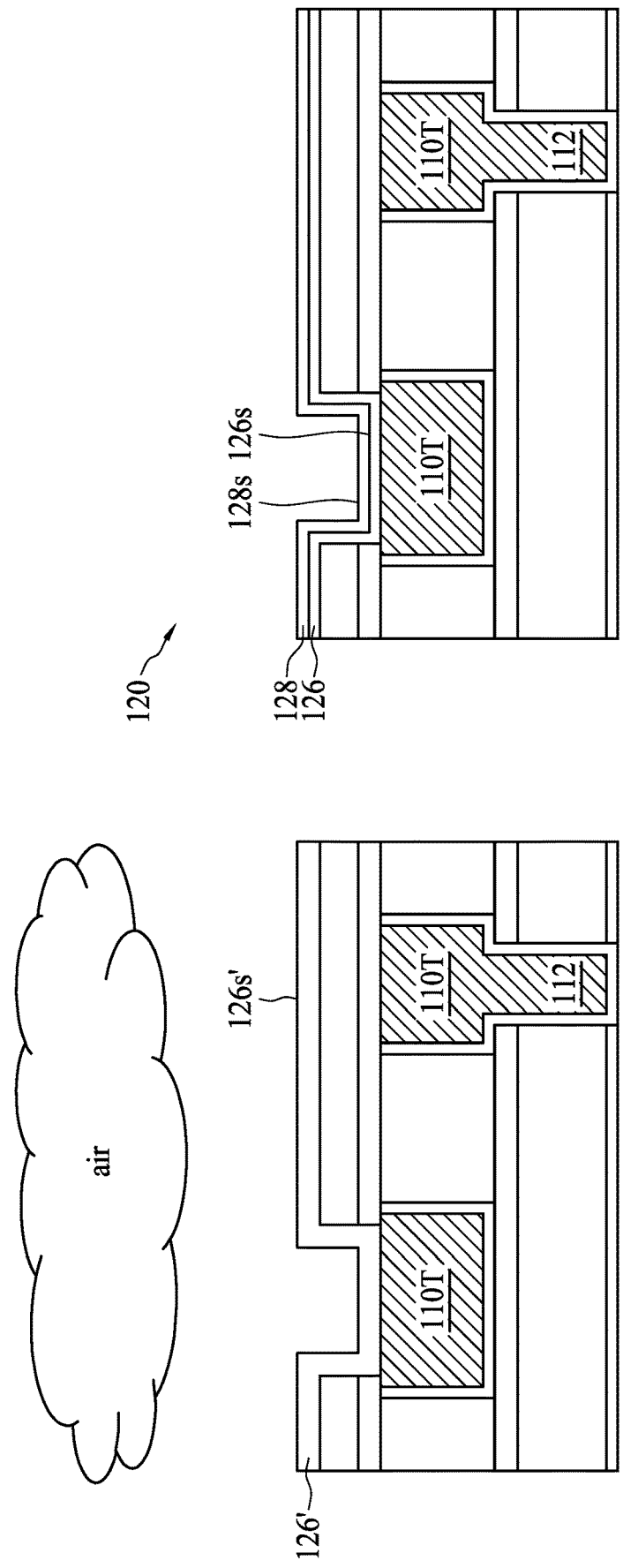
FIG. 5B is a schematic view showing a process of forming the control layer according to embodiments of the present disclosure.

In some embodiments, the control layer 128 may be formed by exposing the barrier layer 126 to air allowing a portion of the metal nitride to oxidize. As shown FIG. 5B, a barrier layer 126' having a top surface 126s' is first deposited as described in operation 250. The barrier layer 126' has a thickness greater than the barrier layer 126 in the fabricated semiconductor device. After deposition of the barrier layer 126', the semiconductor device 100 is removed from the processing system and expose to air for a period of time. The oxygen in air oxidizes the upper portion of the barrier layer 126' forming the control layer 128. After air exposure, the control layer 128 having a composition MxNyOz is formed with a top surface 128s. In some embodiments, the barrier layer 126' is exposed to air for a time period in a range between 5 seconds to about 60 minutes. In some embodiments, the air exposure is performed at room temperature. After air exposure, the metal nitride barrier layer is reduced to the level of the top surface 126s. The control layer 128, defined between surfaces 126s and 128s, may have a thickness in a range between 10 nm and 20 nm. In some embodiments, a ratio of the thickness of the control layer 128 over the thickness of the barrier layer 126' may be in a range between 0.01 and 0.5.

In conventional technology, an oxygen containing layer formed on a barrier layer after exposure to air is removed before formation of a conductive pad layer on the barrier layer with the intention to prevent resistance increase caused by the oxygen containing layer. Unlike conventional technology, embodiments of the present disclosure include operation of air exposure of a barrier layer, such as a metal nitride barrier layer, to form an oxygen containing control layer on the barrier layer. The oxygen containing control layer provides crystalline mismatch with the subsequent conductive pad, reducing the grain size in the conductive pad.

In operation 270, a conductive pad layer 130' is deposited on the control layer 128, as shown in FIG. 4F. The conductive pad layer 130' is formed on the top surface 128s of the control layer 128. The conductive pad layer 130' may include a conductive material, such as aluminum, copper, tantalum, silicon, or an alloy. In some embodiments, the conductive pad layer 130' may be an aluminum copper alloy (AlCu) layer, an aluminum (Al) layer, other conductive material containing aluminum and providing a satisfactory conductivity. The conductive pad layer 130' may be formed using a PVD process, sputtering, evaporation, ALD process or another suitable deposition process. In some embodiments, the conductive pad layer 130' is deposited at a temperature in a range between about 350° C. and about 400° C. to achieve desired grain size. In some embodiments, the conductive pad layer 130' has a thickness in a range from about 100 nm to about 5000 nm.

The conductive pad layer 130' according to the present disclosure has reduced grain size. The grain size of the conductive pad layer 130' starts small at an interface layer and gradually increases. Particularly, the interface layer with a grain size in range between 10 nm and 400 nm is formed on the top surface 128s of the control layer 128. The bulk layer subsequently formed on the interface layer has grain size in a range between 300 nm to 1200 nm.

In operation 280, the conductive pad layer 130' is patterned to form the conductive pad structure 120 as shown in FIGS. 4G-4H. A mask layer 136 may be formed on the conductive pad layer 130'. In some embodiments, the mask layer 136 may include a suitable material, for example, SiON, SIN, SiC, SiOC, spin-on glass (SOG), or a combination thereof. A photoresist layer 138 is deposited on the mask layer 136 and patterned using a suitable photolithography technology, as shown in FIG. 4G. The patterned photoresist layer 138 is used to pattern the mask layer 136. The pattern in the mask layer 136 is then transferred to the conductive pad layer 130', the control layer 128, and the barrier layer 126 using one or more suitable etching processes, resulting in the conductive pad structure 120 on the top conductive layer 110T, as shown in FIG. 4H.

The conductive pad 130 in the conductive pad structure 120 is unlikely to cause extrusion defects because of the reduced grain size and/or gradually increasing grain size distribution. In some embodiments, the reduced grain size may be achieved by creating a concentration peak of the control element in the control layer 128.

Figure 6:
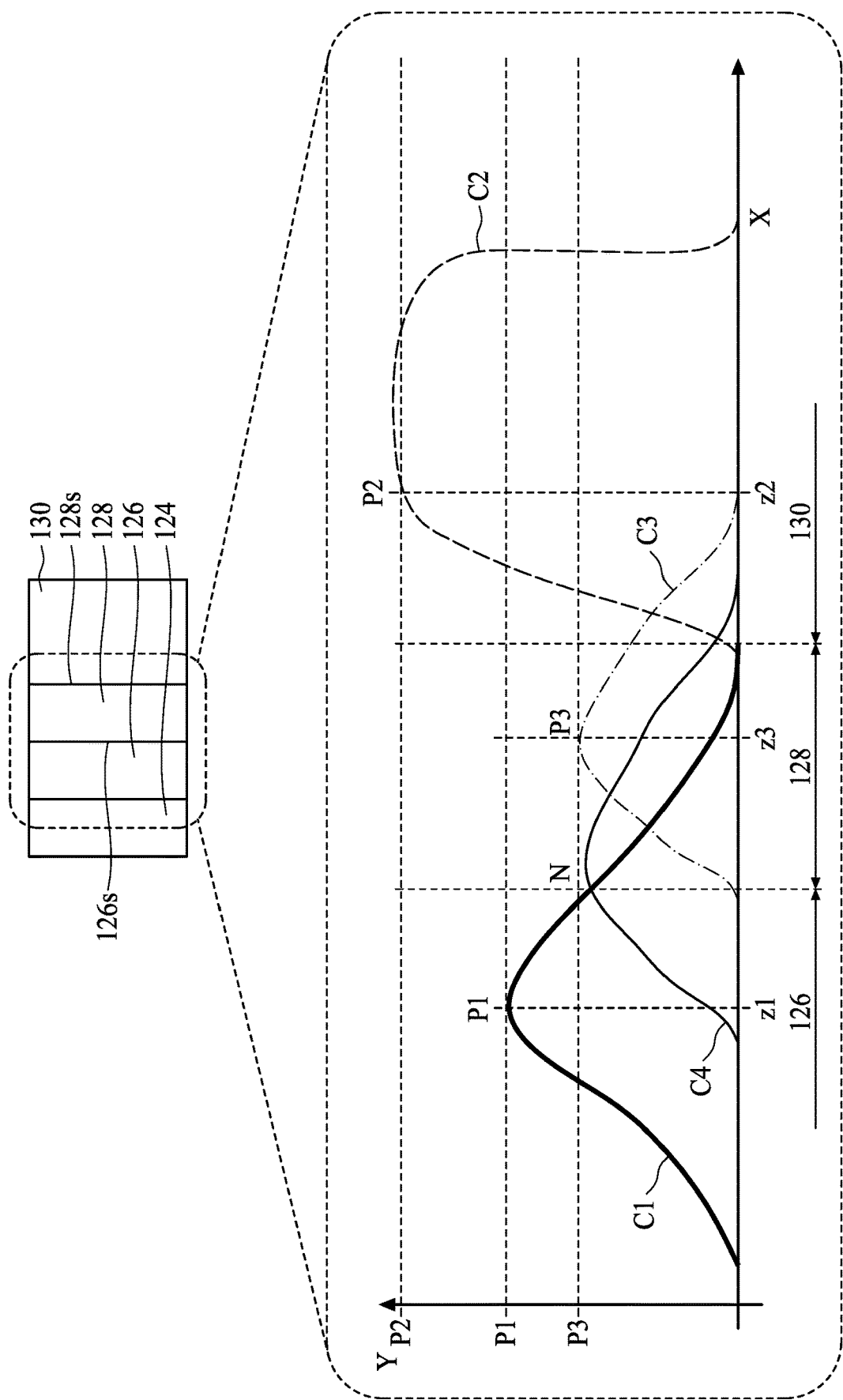
FIG. 6 is a schematic chart showing concentration peaks in a conductive pad structure according to embodiments of the present disclosure.

FIG. 6 is a schematic concentration distribution of various elements across the barrier layer 126, the control layer 128, and the conductive pad 130 in a region marked by 6 in FIG. 4H. In FIG. 6, the x-axis represents location across the various layers, the y-axis indicates concentration of elements in atomic ratio. Curve C1 represents atomic concentration of a first element across the layers. In some embodiments, the first element is tantalum, titanium, tungsten, or other elements suitable to use in a barrier layer. Curve C2 represents atomic concentration of a second element across the layers. The second element may be an aluminum, copper, tantalum, silicon, or any conductive material. Curve C3 represents atomic concentration of a third element across the layers. The third element may be oxygen, or any elements suitable for varying crystalline structure in the control layer. As shown in FIG. 6, a first concentration peak P1 of the first element is located in the barrier layer 126, a second concentration peak P2 of the second element is located in the conductive pad 130, and a third concentration peak P3 of the third element is located between the first concentration peak P1 and the second concentration P2. In some embodiments, the third concentration peak P3 is located in the control layer 128. The peak concentration of the third element is lower than the peak concentration of the first element, i.e. P1>P3. The peak concentration of the third element is also lower than the peak concentration of the second element, i.e. P2>P3. In some embodiments, the peak concentration P3 of the third element, i.e. the control element, may be in a range between about 35% and about 70% in atomic ratio, for example about 50%. A peak concentration of the control element lower than 35% in atomic ratio may not be enough to reduce grain size in the conductive pad 130. A peak concentration of the control element greater than 70% may increase resistivity of the control layer 128 without providing additional benefit in grain size reduction.

Figures 4I, 4J:
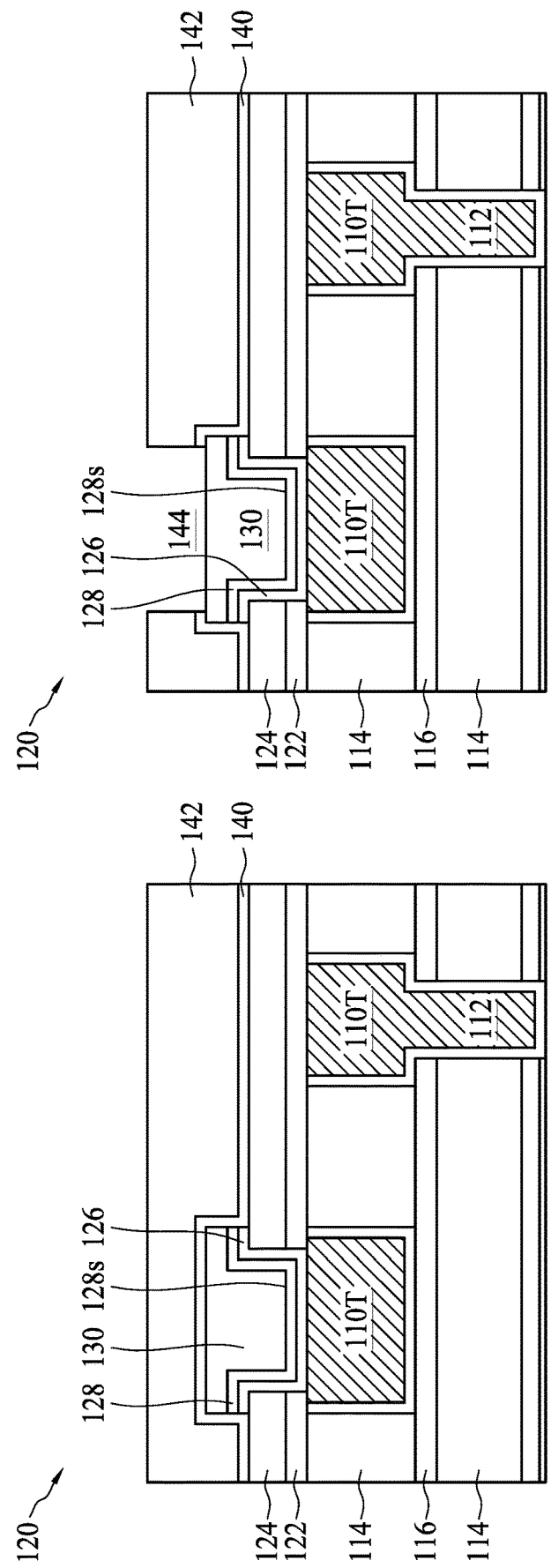
Figure 4K:
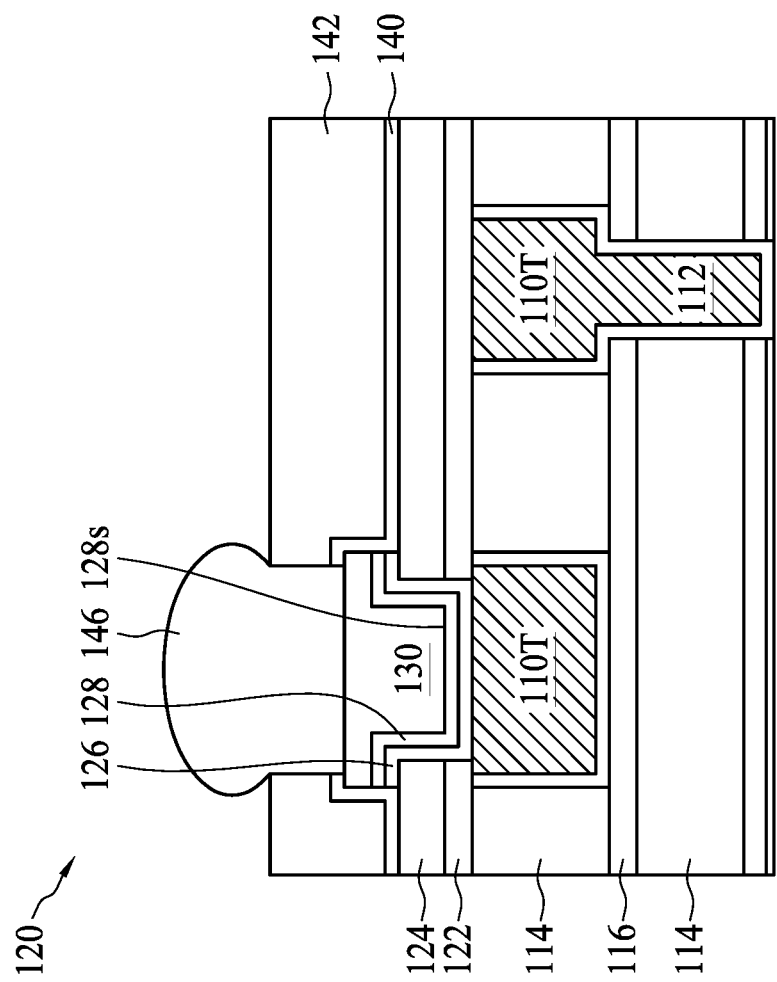

In operation 290, after formation of the conductive pad structure 120, a conductive connection feature 146 may be formed thereon for further connection, as shown in FIG. 4I-4K. An etch stop layer 140 and a passivation layer 142 are formed on the conductive pad structure 120, as shown in FIG. 4I. The etch stop layer 140 may include SiNx, SiCxNy, AlNx, AlOx, AOxNy, SiOx, SiCx, SiOxCy, or other suitable materials. In some embodiments, the passivation layer 142 may include of an organic insulating material such as polyimide, epoxy resin or another suitable insulating material. In other embodiments, the passivation layer 142 may include an inorganic insulating material such as silicon oxide, silicon nitride, silicon oxynitride or suitable low-k dielectric material.

An opening 144 is then formed through the passivation layer 142 and the etch stop layer 140 to expose a portion of the conductive pad 130 in the conductive pad structure 120, as shown in FIG. 4J.

The conductive connection feature 146 is then formed in the opening 144 of the passivation layer 142. The conductive connection feature 146 is in contact with the conductive pad structure 120, as shown in FIG. 4K. The conductive connection feature 146 may be a solder ball as shown in FIG. 4K, or a conductive bump, conductive pillar, or a bonding wire. The conductive pad structure 120 is electrically coupled to an external circuit through the conductive connection feature 146 for transferring electrical signals between the external circuit and the semiconductor device 100 with the conductive pad structure 120. The conductive connection feature 146 may made of aluminum, copper, gold, silver, alloy thereof, a combination thereof, or another suitable conductive material. The conductive connection feature 146 may be formed using evaporation, sputtering, electroplating or printing process.

Figure 7:
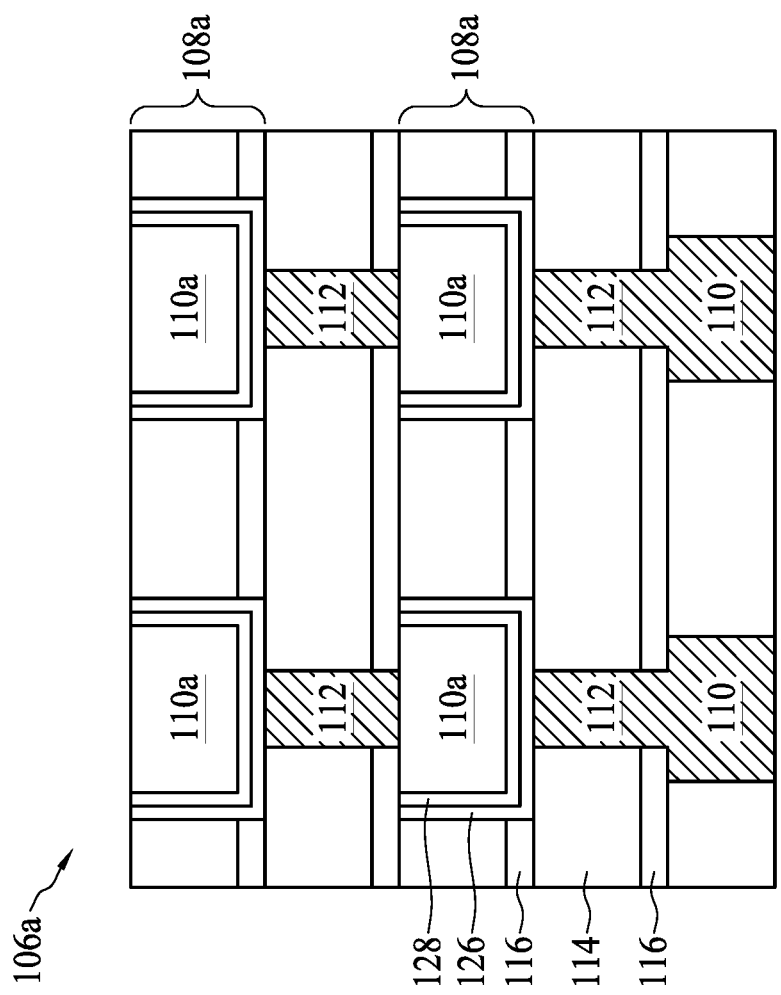
FIG. 7 schematically illustrates an interconnect structure according to embodiments of the present disclosure.

As discussed above, the control layer according to embodiments of present disclosure may be formed within an interconnect structure, such as on upper levels of the interconnect structure 106 to prevent extrusion defects. FIG. 7 schematically illustrate a cross-sectional view of an interconnect structure 106a according to some embodiments of the present disclosure. The interconnect structure 106a is similar to the interconnect structure 106 discussed in FIG. 1, except that one or more upper levels IMD layer 108 includes a control layer 128 disposed between a barrier layer 126 and conductive features 110a. The barrier layer 126 and control layer 128 are as discussed above. The conductive features 110a may be conductive lines form different materials as the lower level conductive features 110. In some embodiments, the conductive features 110 at lower IMD level may be formed from copper, while the conductive features 110a at the upper IMD levels are formed from an aluminum containing material, such as aluminum, or aluminum copper alloy. In some embodiments, the conductive features 112 in the upper level IMD layer may be formed from tungsten. In some embodiments, the conductive features 110 and conductive features 112 may include barrier type material as a liner at interfaces with the IMD layers 108 and/or with each other. Because the conductive features 110a are formed from the control layer 128, the conductive features 110a have reduced grain size and gradually increased grain size, therefore, expanding less during subsequent thermal processing.

Figure 8:
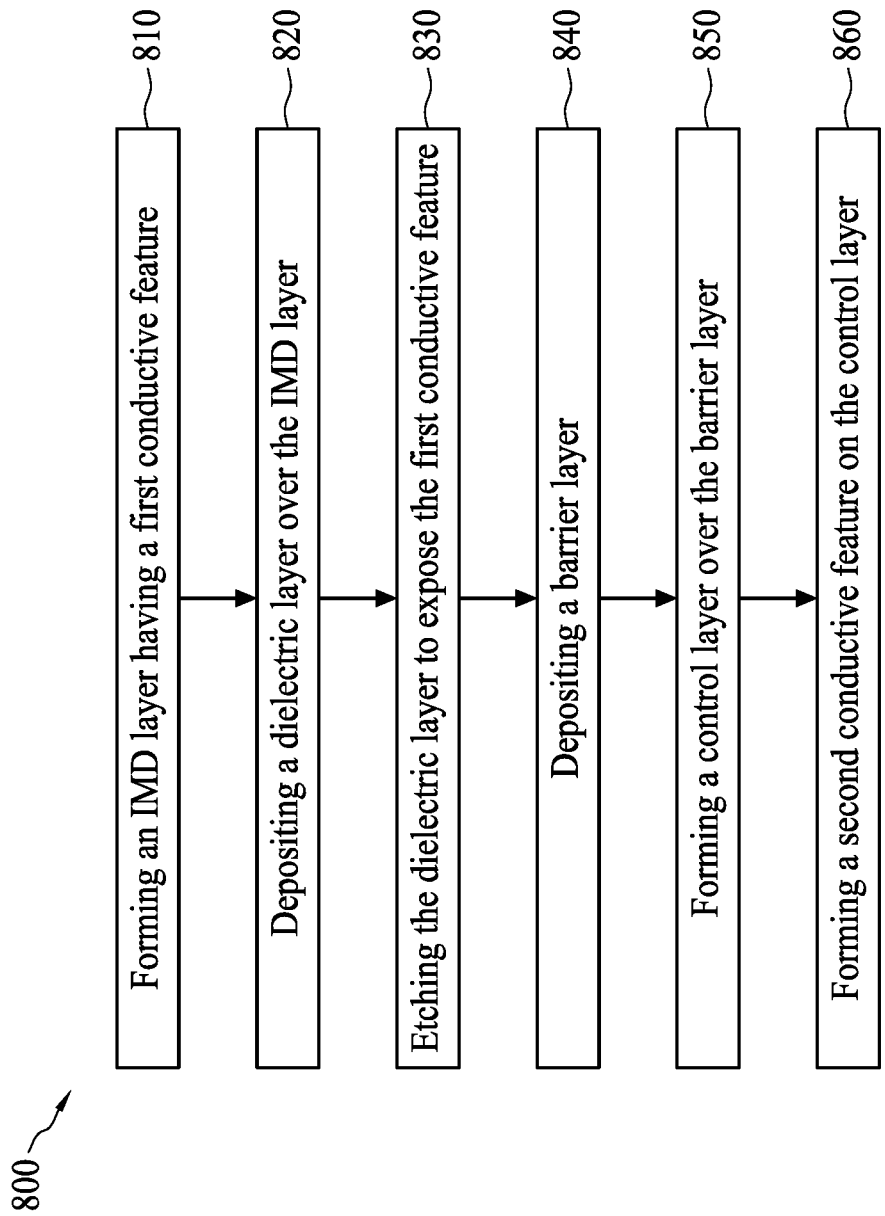
FIG. 8 is a flow chart of a method for manufacturing of an interconnect structure according to embodiments of the present disclosure.

FIG. 8 is a flow chart of a method 800 for manufacturing of an interconnect structure for a semiconductor device according to embodiments of the present disclosure. An interconnect structure 106a may be formed using the method 800. FIGS. 9A-9H schematically illustrate various stages of manufacturing the interconnect structure 106a according to embodiments of the present disclosure. FIGS. 9A-9H are schematic partial sectional views of the interconnect structure 106a.

Figure 9B:
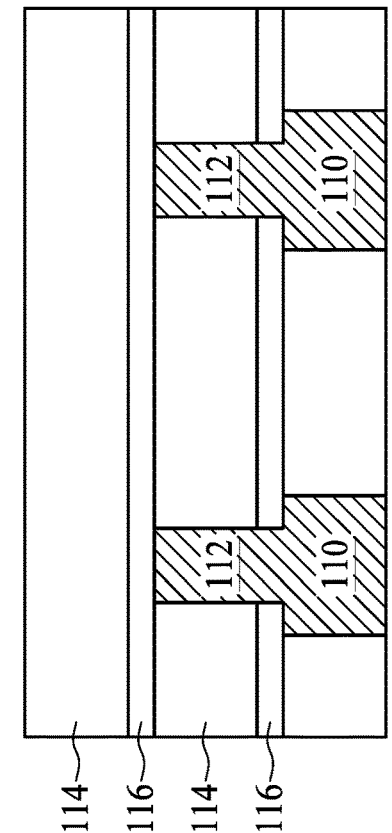
FIGS. 9A-9H schematically illustrate various stages of manufacturing an interconnect structure according to embodiments of the present disclosure.
Figure 9A:
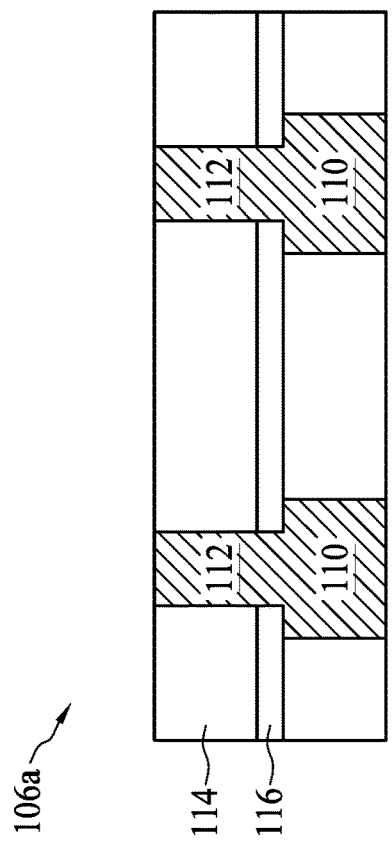
Figure 9D:
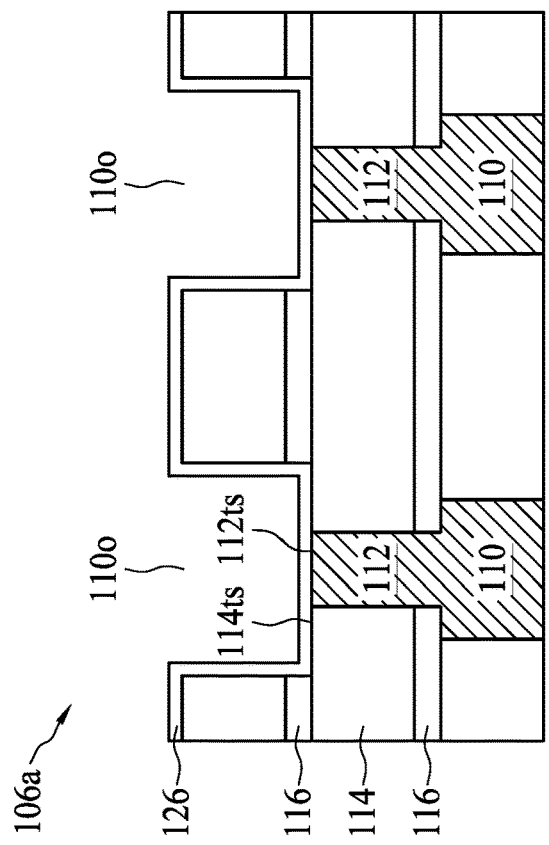

In operation 810, one or more lower level IMD layers 108 are formed in the interconnect structure 106a is as shown in FIG. 9A. The multiple levels of conductive features 110 and 112 are formed in the IMD layers 108 in the interconnect structure 106a. The conductive features 110 may be conductive lines and conductive features 112 may be conductive vias. The conductive features 112 on a top level is exposed to connect with conductive features in the next level IMD layer. In some embodiments, the conductive features 112 may by a tungsten containing conductor.

In operation 820, a low-k dielectric layer 114 is deposited for the next level IMD formation, as shown in FIG. 9B. In some embodiments, an etch stop layer, such as the etch stop layer 116 may be is first deposited and the low-k dielectric layer 114 is deposited on the etch stop layer 116.

Figure 9C:
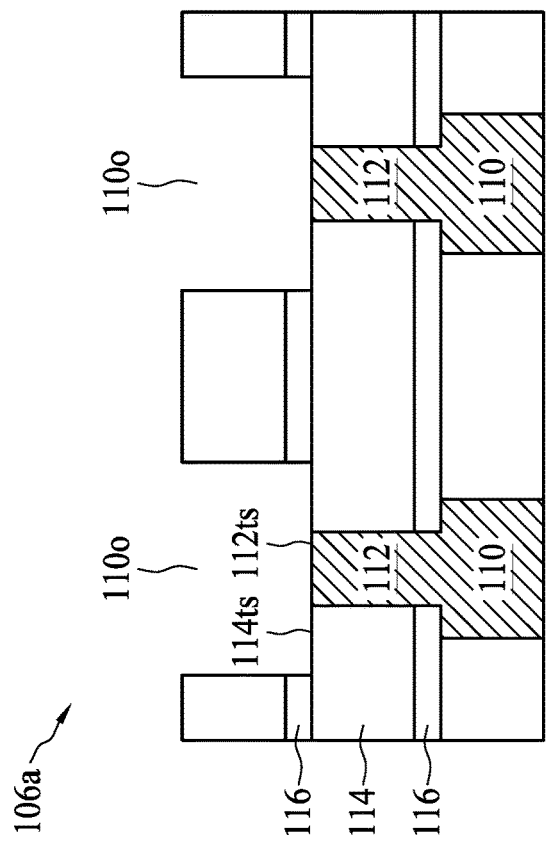

In operation 830, the low-k dielectric layer 114 and the etch stop layer 116 are etched to expose the conductive features 112, as shown in FIG. 9C. Openings 1100 are formed to expose conductive features 112. The opening 1100 has a bottom defined by the top surface 112ts of the conductive feature 112, a portion of top surface 114ts of the lower level, and sidewalls of the low-k dielectric layer 114 and etch stop layer 116.

In operation 840, the barrier layer 126 is deposited over exposed surfaces as shown in FIG. 9C. The barrier layer 126 may be formed substantially similar to the barrier layer formed in operation 250. The barrier layer 126 is formed conformally on the exposed top surface 112ts, 114ts, expose surfaces of the low-k dielectric layer 114, and exposed surfaces of the etch stop layer 116. In some embodiments, the barrier layer 126 includes one or more barrier materials, such as Ta, TaN, Ti, TiN, WN, or the like. In some embodiments, the barrier layer 126 includes a nitride of a first metal element, for example such as tantalum, titanium, tungsten, or other suitable element. The barrier layer 126 may be deposited by any suitable process, such as a physical vapor deposition (PVD) process, sputtering, evaporation, atomic layer deposition (ALD) process or another suitable deposition process. The barrier layer 126 may have a thickness in a range between about 10 nm and about 200 nm.

Figure 9F:
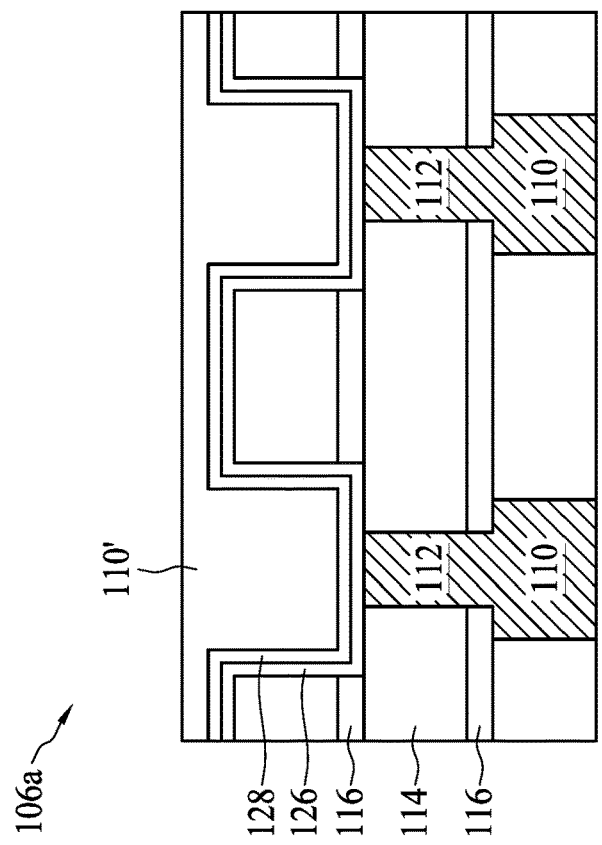
Figure 9E:
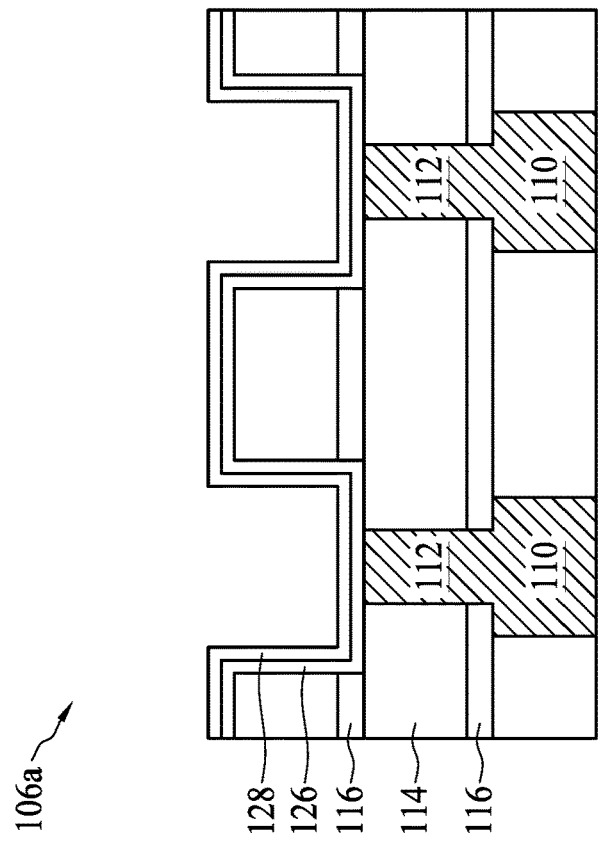

In operation 850, the control layer 128 is formed on the barrier layer 126, as shown in FIG. 9E. The control layer 128 may be formed substantially similar to the control layer 128 formed in operation 260. The control layer 128 may be conformally formed on the barrier layer 126. The control layer 128 includes a composition having a crystalline structure that is mismatch with the crystalline structure of the subsequently formed conductive pad 130. In some embodiments, properties of the control layer 128, such as the composition, the thickness, may be selected according to the composition of the conductive feature 110a to reduce grain size in the conductive pad 130. The control layer 128 may have a thickness in a range between about 2 angstrom and 5 nm. In some embodiments, the control layer 128 includes a composition $M_xN_yO_z$, with y>x or z>x. In some embodiment, the control layer 128 includes a composition $M_xN_yO_z$ with z>x.

Figure 9H:
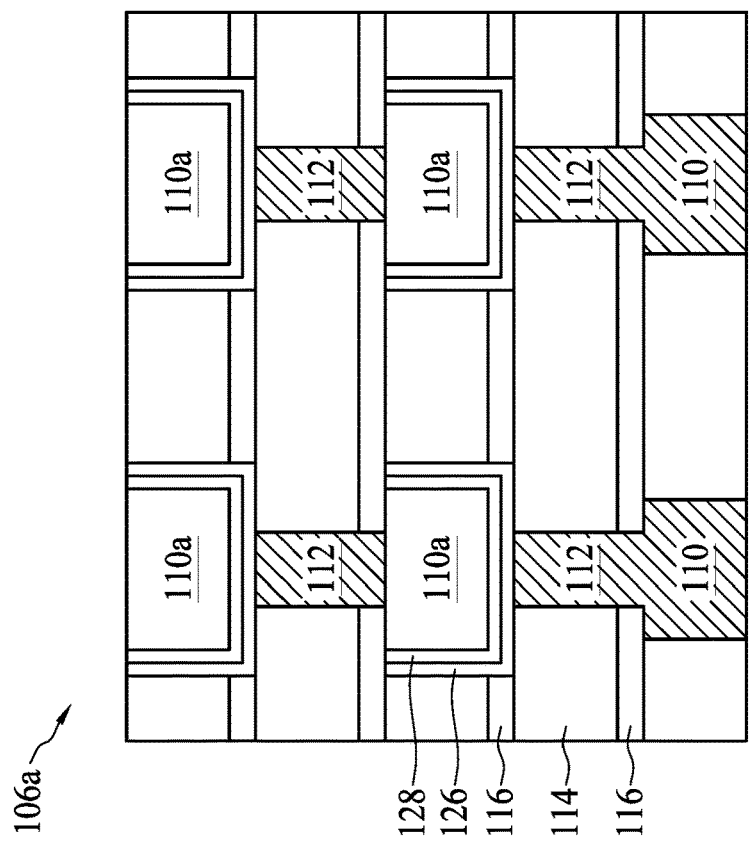
Figure 9G:
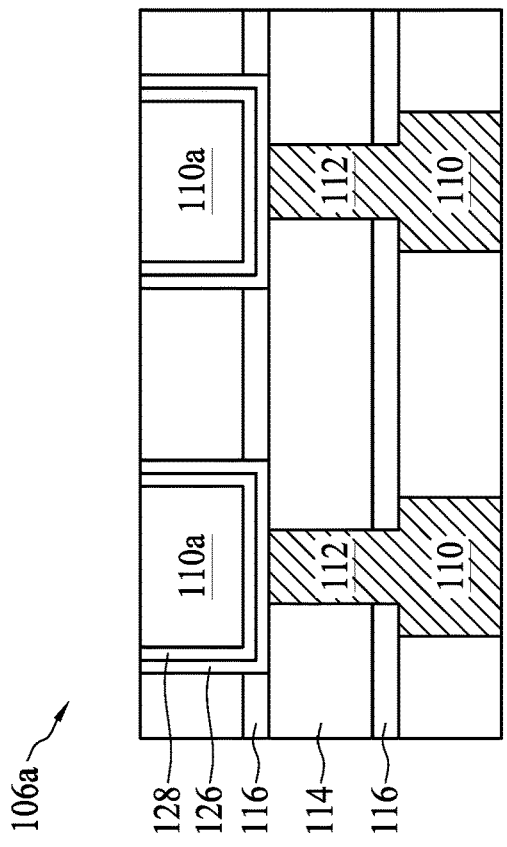

In operation 860, a conductive layer 110' is deposited on the control layer 128, as shown in FIGS. 9F-9G. The conductive layer 110' is formed on the top surface 128s of the control layer 128. The conductive layer 110' may include a conductive material, such as aluminum, copper, tantalum, silicon, or an alloy. In some embodiments, the conductive layer 110' may be an aluminum copper alloy (AlCu) layer, an aluminum (Al) layer or made of other conductive material containing aluminum and providing a satisfactory conductivity. The conductive pad layer 130' may be formed using a physical vapor deposition (PVD) process, sputtering, evaporation, atomic layer deposition (ALD) process or another suitable deposition process. In some embodiments, the conductive layer 110' is deposited at a temperature in a range between about 350° C. and about 400° C. to achieve desired grain size. In some embodiments, a planarization process, such as CMP, is performed to remove excessive materials and forming the conductive features 110a, as shown in FIG. 9G.

Operations 810-860 may be repeated to form another IMD level to reduce extrusion defects of conductive feature in that IMD level. In FIG. 9H, two IMD levels include conductive features 110a formed from the control layer 128. The control layer 128 may be formed between a barrier layer and a conductive feature whenever extrusion of the conductive feature may be a concern.

Various embodiments or examples described herein offer multiple advantages over the state-of-art technology. The control layer according to the present disclosure reduce grain size of a metal containing layer, thus decreases extrusion defects and improve throughput. The control layer may be used to form conductive pads over an interconnect structure. The control layer may also be used within an interconnect structure.

It will be understood that not all advantages have been necessarily discussed herein, no particular advantage is required for all embodiments or examples, and other embodiments or examples may offer different advantages.

Some embodiments of the present provide a semiconductor device. The semiconductor device comprises: an interconnect structure on a substrate, wherein the interconnect structure comprises a top conductive layer; and a conductive pad structure on the interconnect structure, wherein the conductive pad structure comprises: a barrier layer on the top conductive layer, wherein the barrier layer comprises a first element; a control layer on the barrier layer; and a conductive pad on the control layer, wherein the conductive pad comprises a second element, wherein the control layer comprises the first element and a third element, a first concentration peak of the first element is located in the barrier layer, a second concentration peak of the second element is located in the conductive pad, a third concentration peak of the third element is located within the control layer, and the third concentration peak is lower than the first concentration peak and the second concentration peak.

Some embodiments of the present disclosure provide a semiconductor device. The semiconductor device includes a substrate having a plurality of electronic components; a first dielectric layer over the plurality of electronic components; a first conductive feature embedded in the first dielectric layer; a barrier layer on the first conductive feature, wherein the barrier layer comprises a first metal element and nitrogen, and has a first thickness; a control layer on the barrier layer, wherein the control layer has a second thickness, and a ratio of the second thickness over the first thickness is in a range between 0.01 and 0.5; and a second conductive feature on the control layer, wherein the second conductive feature comprises a second metal element, wherein the control layer comprises the first metal element, nitrogen, and a third element, and the third element has a higher concentration than the first metal element in the control layer.

Some embodiments of the present disclosure provide a method. The method comprises forming an interconnect structure over a substrate, wherein the interconnect structure comprises a top conductive layer; depositing a barrier layer on the top conductive layer, wherein the barrier layer comprises a first element; forming a control layer on the barrier layer; and depositing a conductive pad layer on the control layer, wherein the conductive pad layer comprises a second element; and patterning the conductive pad layer, the control layer, and the barrier layer to form a conductive pad structure; wherein the barrier layer includes a first concentration peak of the first element, the conductive pad layer includes a second concentration peak of the second element, the control layer comprises the first element and a third element, a third concentration peak of the third element is located within the control layer, and the third concentration peak is lower than the first concentration peak and the second concentration peak.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a semiconductor device, comprising:
  forming an interconnect structure over a substrate, wherein the interconnect structure comprises a top conductive layer;
  depositing a barrier layer on the top conductive layer, wherein the barrier layer comprises a first element;
  forming a control layer on the barrier layer; and
  depositing a conductive pad layer on the control layer, wherein the conductive pad layer comprises a second element; and patterning the conductive pad layer, the control layer, and the barrier layer to form a conductive pad structure;
wherein the barrier layer includes a first concentration peak of the first element, the conductive pad layer includes a second concentration peak of the second element, the control layer comprises the first element and a third element, a third concentration peak of the third element is located within the control layer, and the third concentration peak is lower than the first concentration peak and the second concentration peak.

2. The method of claim 1, wherein forming the control layer comprises adding the third element into an upper portion of the barrier layer.

3. The method of claim 2, wherein the third element is oxygen, and adding the third element comprises exposing the barrier layer to air.

4. The method of claim 3, wherein the barrier layer has a first thickness, the control layer has a second thickness, and a ratio of the second thickness over the first thickness is in a range between 0.01 and 0.5.

5. The method of claim 1, wherein depositing the barrier layer comprises depositing nitride layer of the first element, and the first element is tantalum, titanium, or tungsten, the second element is aluminum, copper, or tantalum, and the third element is oxygen.

6. A method, comprising:
forming an interconnect structure on a substrate, wherein the interconnect structure comprises a top conductive layer; and
forming a conductive pad structure on the interconnect structure, wherein the conductive pad structure comprises:
a barrier layer on the top conductive layer, wherein the barrier layer comprises a first element;
a control layer on the barrier layer; and
a conductive pad on the control layer, wherein the conductive pad comprises a second element,
wherein the control layer comprises the first element and a third element, a first concentration peak of the first element is located in the barrier layer, a second concentration peak of the second element is located in the conductive pad, a third concentration peak of the third element is located within the control layer, and the third concentration peak is lower than the first concentration peak and the second concentration peak.

7. The method of claim 6, wherein the first element is tantalum, titanium, or tungsten, the second element is aluminum, copper, or tantalum, and the third element is oxygen.

8. The method of claim 7, wherein the control layer further comprises nitrogen.

9. The method of claim 6, wherein the barrier layer has a first thickness, the control layer has a second thickness, and a ratio of the second thickness over the first thickness is in a range between 0.01 and 0.5.

10. The method of claim 9, wherein the first thickness is in a range between 10 nm and 200 nm.

11. The method of claim 10, wherein the control layer has a composition $M_xN_yO_z$, M denotes the first element, N denotes nitrogen, O denotes oxygen, x, y, z are numerals, and z is greater than x.

12. The method of claim 11, wherein the third concentration peak is in a range between 35% and 70%.

13. The method of claim 9, wherein the conductive pad includes an interface layer in contact with the control layer, and a grain size in the interface layer is in a range between 10 nm and 400 nm.

14. A method, comprising:
providing a substrate having a plurality of electronic components;
depositing a first dielectric layer over the plurality of electronic components;
forming a first conductive feature embedded in the first dielectric layer;
forming a barrier layer on the first conductive feature, wherein the barrier layer comprises a first metal element and nitrogen, and has a first thickness;
forming a control layer on the barrier layer, wherein the control layer has a second thickness, and a ratio of the second thickness over the first thickness is in a range between 0.01 and 0.5; and
forming a second conductive feature on the control layer, wherein the second conductive feature comprises a second metal element,
wherein the control layer comprises the first metal element, nitrogen, and a third element, and the third element has a higher concentration than the first metal element in the control layer.

15. The method of claim 14, further comprising:
depositing a second dielectric layer in contact with the barrier layer; and
forming an opening in the second dielectric layer, wherein the second conductive feature formed disposed in the opening in the second dielectric layer.

16. The method of claim 15, wherein the second dielectric layer is an intermetal dielectric (IMD) layer in an interconnect structure on the substrate.

17. The method of claim 15, wherein the second dielectric layer is a passivation layer over an interconnect structure on the substrate, and the first conductive feature is a top conductive feature of the interconnect structure.

18. The method of claim 14, wherein the second conductive feature includes an interface layer in contact the control layer and a bulk layer in contact with the interface layer, the interface layer has a first grain size in a range between 10 nm and 400 nm, and the bulk layer has a second grain size in a range between 300 nm and 1200 nm.

19. The method of claim 18, wherein the second conductive feature has a third thickness, the interface layer has a fourth thickness, and a ratio of the fourth thickness over the third thickness is in a range between 0.01 and 0.1.

20. The method of claim 15, wherein a first concentration peak of the first metal element is located in the barrier layer, a second concentration peak of the second metal element is located in the second conductive feature, a third concentration peak of the third element is located within the control layer, and the third concentration peak is lower than the first concentration peak and the second concentration peak.

* * * * *